United States Patent [19]

Whetstone et al.

[11] 4,109,374
[45] Aug. 29, 1978

[54] SUPERCONDUCTOR COMPOSITE AND METHOD OF MAKING THE SAME

[75] Inventors: Clayton N. Whetstone, San Diego, Calif.; Douglas A. Koop, Lower Burrell; James D. Dowd, Oakmont, both of Pa.

[73] Assignee: Aluminum Company of America, Pittsburgh, Pa.

[21] Appl. No.: 608,633

[22] Filed: Aug. 28, 1975

[51] Int. Cl.² .......................................... H01V 11/00
[52] U.S. Cl. ................................. 29/599; 174/128 S
[58] Field of Search ............ 29/599; 174/126 S, 128 S

[56] References Cited

U.S. PATENT DOCUMENTS

| 3,115,612 | 12/1963 | Meissner | 338/32 |
| 3,167,692 | 1/1965 | Matthias | 317/158 |
| 3,215,569 | 11/1965 | Kneip, Jr. et al. | 29/599 UX |
| 3,218,693 | 11/1965 | Allen et al. | 29/599 |
| 3,471,925 | 10/1969 | El Bindari | 29/599 |
| 3,509,622 | 5/1970 | Bernert et al. | 29/599 |
| 3,623,221 | 11/1971 | Morton et al. | 29/599 |
| 3,625,662 | 3/1966 | Roberts et al. | 29/599 |
| 3,675,042 | 7/1972 | Merriam | 174/126 |
| 3,714,371 | 1/1973 | Nomura et al. | 174/126 CP |
| 3,778,895 | 12/1973 | Nomura et al. | 29/599 |
| 3,837,066 | 9/1974 | Mori et al. | 29/599 |
| 3,890,700 | 6/1975 | Diepers et al. | 29/599 |

Primary Examiner—C.W. Lanham
Assistant Examiner—V. K. Rising
Attorney, Agent, or Firm—Carl R. Lippert; Andrew Alexander

[57] ABSTRACT

A selectively constituted stabilized multiple element or cell superconductor composite comprising a plurality of cores of stabilizing material with each of the cores surrounded by a tube of superconducting material in intimate contact therewith and a matrix body of normally conductive material surrounding and intimately contacting the superconducting metal tubes, thereby separating each tube from other tubes in the superconductor composite. The stabilized superconductor composite is formed by mechanically reducing a composite body of matrix material, tubes and cores simultaneously. The various materials in the composite are selected to balance properties so as to facilitate the working thereof into the desired final size and configuration.

25 Claims, 4 Drawing Figures

SUPERCONDUCTOR COMPOSITE AND METHOD OF MAKING THE SAME

This invention relates to superconductor composites comprising superconductive and normally conductive portions and to such where the superconductors are stabilized by a metal with a relatively low electrical resistivity such as high purity aluminum. The invention also relates to methods of making such superconductor composites.

BACKGROUND

In the past niobium-titanium, niobium-tin and vanadium-gallium have been substantially employed as superconductor materials, but to date each is saddled with some limitations. Niobium-tin and vanadium-gallium superconductors are largely limited in their applications because both comprise compounds normally formed by reaction of the respective materials in situ and the reaction product compounds tend to be quite brittle. This brittleness tends to seriously limit further fabrication and even limits the ability of the superconductor to be bent or wound through the relatively small diameters sometimes required to wind magnets. Noibium-titanium alloys, by comparison, when used in certain matrix material are not quite as limited. For instance, noibium-titanium superconductor in a copper matrix has seen substantial application although rapid magnetic field changes have to be avoided since they can produce instabilities in the superconductor, which can generate heat and the resultant deterioration of the superconducting state.

A desirable superconductor composite should generate minimum heat even in rapidly changing magnetic fields and have components which will dissipate any heat which might be generated without adversely affecting electrical performance. The superconductor composite desirably includes a stabilizing member which should have very low electrical resistivity at superconductor operating temperatures, which member can provide an alternate more or less low resistance path for electric current if a region of resistance is encountered in the superconducting member. Additionally, a desirable multiple strand superconductor composite should have a matrix of normally conductive material, or material which has relatively high electrical resistivity at superconductor operating temperatures, to help reduce inductive or eddy current coupling losses between or among the individual superconducting members and minimize the attendant generation of heat. Plastics and other nonconductors satisfy the resistivity requirements for the matrix but lack sufficient strength and ductility required for drawing of fine wire composites comprising multiple superconductor strands.

High purity aluminum used as a stabilizer and aluminum alloy used as a matrix material could provide the needed properties for stabilizer and matrix. High purity aluminum provides low electrical resistivity at superconducting temperatures typically having an electrical resistivity about 10 times less than copper at superconducting temperatures. With respect to the matrix material, aluminum alloy offers advantages because of relatively high electrical resistivity at superconducting temperatures and of good strength, ductility and fabricability. Further, the combination of high purity aluminum as a stabilizer and the aluminum alloy as matrix material in a superconductor offers another advantage in that their respective densities are much less than material commonly used in superconductors. For instance, aluminum has a density of about one-third that of copper and since their respective strength levels can be approximately equal, aluminum can provide a strength-to-weight ratio in the order of 3 to 4 times greater than copper. Strength and weight are important when both Lorentz forces and centrifugal forces are encountered such as in rotating machinery applications, for example power generators. The combination of high purity aluminum and aluminum alloy is beneficial in yet another way when compared to copper; it has a smaller heat capacity which results in energy saving in thermocycling from ambient to cryogenic temperatures. Additionally, aluminum has much greater thermal conductivity at superconducting operating temperatures, when compared to copper and many other materials, and thus allows faster dissipation of any heat that may be generated to the surroundings.

Regardless of these potential advantages, aluminum, especially high purity aluminum, has been limited in its use because of fabricating problems due to its softness. Under conventional practices, in drawing a superconductor having a soft aluminum stabilizer, a drawing problem known in the art as a "flowing phenomena" occurs. That is, the soft aluminum stabilizer has been difficult, if not impossible, to co-reduce with the other components of the superconductor composite, principally the superconducting elements, with consistently satisfactory results. This problem severely limits the use of aluminum, especially high purity aluminum, or any other relatively soft material used as a stabilizer in conventional superconductor composites. Also, under current fabrication practices for conventional superconductor composites, such as annealing, and particularly the precipitation heat treating of the superconductor members, alloying constituents of the matrix can migrate to the stabilizer often seriously increasing its resistivity and diminishing its stabilizing effect which leads to impairment of the composite superconductor performance.

This invention overcomes these problems of using high purity aluminum or a relatively soft stabilizing material in superconductor composites by providing an improved superconductor composite and a method of making the same.

SUMMARY

A stabilized superconductor composite is provided comprising a plurality of elongate hollow tubes of superconductor material containing therewithin cores of stabilizing material in intimate contact therewith all situated within a body of normal electrically resistive matrix material which surrounds and intimately contacts each superconducting metal layer or tube, thereby separating each of the layers or tubes. The superconductor tube, in turn, separates the stabilizing cores from the matrix. The stabilized superconductor composite is formed by providing cores of stabilizing material inside tubes of superconducting metal and placing such into holes or passages provided in a body of matrix material to provide a workable composite stock. This stock is mechanically reduced to form the superconductor composite rod, wire or other products. The matrix and superconductor metal working characteristics are carefully balanced such that their flow stress levels in the specific working operations performed facilitate laminar flow conditions.

An object of the invention is to provide a high purity aluminum stabilized superconductor composite.

Another object is to provide a high purity aluminum stabilized superconductor composite capable of withstanding sudden changes in a magnetic field without losing its superconducting properties.

Another object is to provide a worked superconductor composite having a soft stabilizer such as high purity aluminum, a superconducting material and a matrix of a higher strength material than the stabilizer such as an aluminum alloy.

Another object is to provide a method of producing a worked superconductor composite having a stabilizing core of relatively soft material when compared to other materials in the composite.

These, as well as other objectives, will become apparent from a reading of the disclosure and claims and an inspection of the accompanying drawings appended thereto.

BRIEF DESCRIPTION OF THE FIGURES

In the description below, reference is made to the following drawings in which.

DETAILED DESCRIPTION

Figures 1, 3:
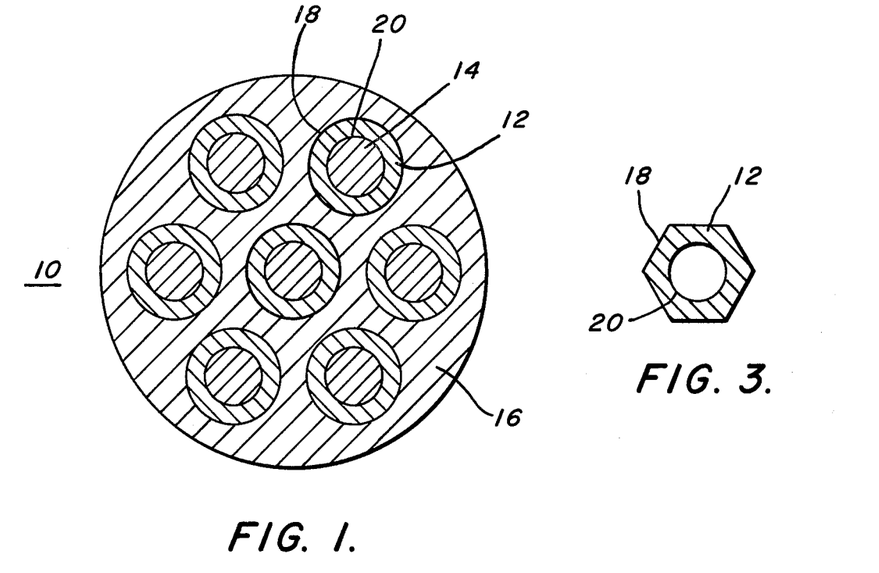
FIG. 1 is an elevation view in cross-section illustrating an embodiment of the superconductor composite of the present invention.
FIG. 3 is an elevation view in cross-section illustrating an alternate configuration of superconducting tubes of the present invention.

FIG. 1 illustrates a section, generally referred to as 10, of an embodiment of a superconductor composite in accordance with the present invention. In the superconductor composite 10, superconductive members are depicted in the form of tubes 12 having an outside surface wall 18 and inside surface wall 20. Each tube 12 surrounds and is in intimate contact with a core 14 of stabilizing material and is spaced from the other tubes by the normally conductive matrix material 16 which is in intimate contact with tubes 12 and is relatively resistive electrically at superconducting temperatures. The tubes 12 of superconducting material surround and separate the stabilizing core material 14 from the normal resistive matrix material 16. This interrelationship of superconducting tubes 12, stabilizing material 14 and normal matrix material 16 as just briefly described is an important aspect of the present invention which helps overcome problems such as described earlier and provides an economically fabricated superconductor with improved stability characteristics.

It is to be understood that while FIG. 1 has been discussed as illustrative of the improved superconductor composite in its final size or gauge thickness, it also can be viewed as representative of the condition of earlier intermediate stages or products or even the initial composite working stock. Hence, composite 10 refers to the assembled composite, comprising tubes 12 and cores 14 at various stages of fabrication. While the final product typically has the same configuration as the initial composite stock, but substantially reduced in cross-section, such is not necessarily always the case.

For instance, the tubes 12 of superconducting material are shown in FIG. 1 as being substantially circular in cross-section. However, because of the metal working forces, the circular shape may be slightly distorted from a perfect or true circle. In fact, in some instances it may be advantageous to provide a superconductor composite which is substantially rectangular in cross-section, which can be useful to facilitate a compacted winding about a magnet, or even one which has a high aspect ratio. It is within the purview of this invention to have a generally cylindrical starting assembly as in FIG. 2 and change the configuration of that assembly to those just mentioned because such superconductor composites provide more efficient windings. For instance, a generally round wire produced by extruding and possibly drawing can be roll flattened to alter that configuration. With this in mind, it will be understood then that the circular configuration of the superconducting tubes 12 depicted in FIG. 1 may be quite substantially altered during fabrication of the superconductor composite, especially after the final reductions in cross-sectional area have occurred. Also, it should be understood that the number of tubes 12 in the matrix 16 can vary widely even though only seven have been shown for purposes of illustration.

Figure 2:
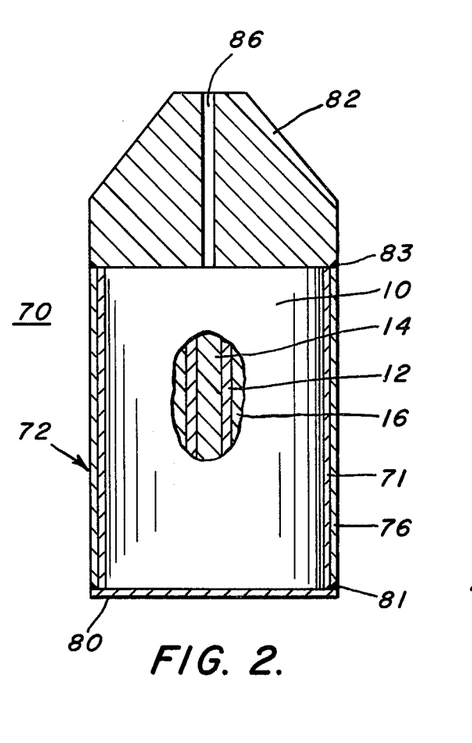
FIG. 2 is an elevation view in cross-section illustrating composite working stock in accordance with the invention.

Referring to FIG. 2, the composite working stock 10 may be encased in capsule assembly 70 suitable for extruding. The working stock body comprises tubes 12, cores of stabilizing material 14 and matrix material 16 and is shown placed in a snug fitting cylindrical container 72 which may comprise an inner layer 71 of copper and an outer layer 76 of a readily worked aluminum alloy such as alloy 3003. The container 72 has a bottom 80 and a nose cone 82, both of which can be aluminum alloy 3003 and are welded in place by welds 81 and 83 to provide the capsule assembly 70. In using snug fitting as above, it is meant that the annular space between composite stock 210 and the cylindrical copper layer 71 and between the respective layers 71 and 76 should not be greater than 0.01 inch and preferably as small as possible. Nose cone 82 can be provided with a passage 83 to provide a means for withdrawing air from within capsule assembly 70. Evacuating air is preferred as reducing the likelihood of encountering voids or blisters in the initial mechanical reducing or metal working steps.

The capsule assembly 70 in this form can be subjected to extrusion or other metal working procedures to form the superconductor composite 10. Typically after an initial extruding step, the container 72 components are removed giving the extruded assembly a configuraton in cross-section essentially as shown in FIG. 1, which extruded assembly may be further reduced in cross-section as by drawing to superconductor composite wire substantially as desired.

The tubes 12 of superconducting material, metal or otherwise, in accordance with the present invention, can typically be formed from a ductile superconducting material such as an alloy comprising titanium and niobium (which can also be referred to as columbium). One preferred metal composition of the alloy consists essentially of about 45% niobium and about 55% titanium. All percentages for compositions expressed herein are in weight percent. However, presently preferred compositions can range from about 30% niobium to substantially all niobium, the remainder, if any, normally titanium, though a typically preferred range is about 40 to 60% niobium, with the remainder in each case being titanium. Also, in certain instances it may be desirable to add up to about 5% total of zirconium, hafnium, vanadium, molybdenum, rhenium, tungsten or tantalum or sometimes combinations thereof, to the Nb-Ti alloys, typically not over 5% each, 10% total. In a broad sense, the superconducting tubes 12 can comprise superconducting material characterized by having a substantially nil electrical resistivity (e.g. less than $10^{-11}$ ohm-cm) at superconducting temperatures and sufficient workability as to be fabricated into useful shapes preferably by normal working procedures such as extrusion, rolling, swaging, drawing, and the like. Thus, the invention contemplates materials, usually metals and typically of the alloy types described, having the desired very low resistivity characteristic of the superconducting state or condition at some superconducting temperature, typically around 4.2° Kelvin.

Fabrication of the superconducting tubes 12 include providing a body or working stock of suitable composition and forging, drilling or piercing the stock and thereafter fabricating tubes therefrom by a series of steps which may include extruding, tube reducing and drawing typically with intermittent annealing to ease fabrication. The manufacture of the superconductor tube members 12 preferably includes cold working procedures and the tubes are preferably provided in a cold worked condition in order to have a fine grain or grain fragment internal structure or texture. A fine texture tends to favor continuity of laminar metal flow during directional metal working operations as used to fabricate the improved composite into useful sizes and shapes, which operations often involve drastic total reductions in cross-section to produce rather fine gauge sizes. If the tubes 12 have large grains, such can tend to produce problems during fabrication sometimes resulting in breakage since large grains can interfere with the desired directional and laminar metal flow.

In FIG. 1, it will be noted that both the outside 18 and inside walls 20 of the tubes 12 are circular in cross-section. It may be desirable in certain instances to have the inside wall 20 circular and the outside wall 18 defined by a number of straight lines or vice versa, although it is often preferred to retain the circular inside wall 20. An example would be a hexagonal outside shape and a circular inside shape as depicted in FIG. 3. Also, it may be desirable to have both outside 18 and inside 20 walls made to conform to a rectangular or hexagonal shape or some similar shape, in cross-section. Having a tube shape, such as hexagonal, can permit a greater number of superconductor elements 12 in a unit of cross-sectional area of matrix when compared to circular tubes, particularly when the matrix has circular cross-section as depicted in FIG. 1. One thing which can be important in the area of tube geometry is that the inside and outside be concentric, preferably within 2% or, still better, within 1% to favor uniform laminar flow.

Preferably the stabilizing core material 14 in the present invention is at least 99.99%, more preferably 99.999%, pure aluminum. In a preferred aspect, the present invention contemplates using core material having electrical resistivity and thermal conductivity substantially equivalent to or at least comparing favorably with that of high purity aluminum or where the electrical resistivity is substantially equal to or lower and the thermal conductivity is substantially equal to or higher than high purity aluminum at superconducting temperatures. The core material 14 in the present invention is used as a stabilizer at the superconducting temperature of the superconductor, typically 4.2° Kelvin. By stabilizer, is meant that the core material stabilizes the electrical current carrying capacity of the superconductor. In a simplified explanation of stabilizing, the core provides an alternate route for electrical energy encountering regions of increased electrical resistance in the superconducting material, and thus the electrical energy, instead of generating heat in response to the resistance region, effectively or partially bypasses that resistance through the stabilizer. In this way, the superconducting composite does not suffer excessive losses in its superconducting capacity by excessive generation of heat in localized resistive regions. The core material should have a comparatively low electrical resistivity, preferably $10^{-7}$, more preferably $10^{-8}$, ohm-cm or lower at the superconducting temperature. This resistivity is intermediate that of the superconductor and the resistive matrix. That is, it should be substantially greater than the superconductor but substantially less than the matrix in resistivity at superconducting temperatures. In addition to the preferred aluminum of 99.999% minimum purity, low electrically resistive metals useful in practicing the invention can include OFHC (oxygen-free high conductivity) or other suitable grades of copper and perhaps certain versions of less pure aluminum, for instance 99.99% pure, if the $10^{-7}$ ohm-cm resistivity level at superconducting temperatures is satisfied. Also the core itself can be something of a composite in that it can be strengthened by dispersion or fiber reinforcement. Here the described types of material, for instance pure aluminum, form a matrix strengthened by the reinforcing material which is selected as to not detract excessively from the low electrical resistivity or the thermal conductivity. For instance, an aluminum oxide dispersion in high purity aluminum offers the advantage of improved strength and flow stress over a non-reinforced high purity aluminum so as to still further enhance the fabricability of the superconducting composite according to the invention. Broadly speaking, the term high purity aluminum contemplates the preferred 99.999% pure aluminum referred to and also such less pure versions as satisfy the $10^{-7}$ ohm-cm maximum resistivity and still further to such high purity aluminum reinforced with a suspended or dispersed phase as just described.

The matrix material 16 in the present invention may be any desired normally resistive material, that is, a normally conductive material, which satisfies the other criteria therefor as herein set forth. Normal electrical conducting materials include materials, for instance aluminum alloys, which may be considered conductors at room temperature but provide rather high resistivity compared to the superconductor (and even compared to the stabilizer) at superconducting temperatures. As a minimum, its resistivity has to be substantially greater than that of the stabilizing material. The electrical resistance is important in that it reduces coupling between the superconducting elements at superconducting temperatures, and thus can reduce the chance of heat generation and its harmful effects on superconducting characteristics of the composite. The electrical resistivity of the matrix should be at least $10^{-7}$ ohm-cm, preferably $10^{-6}$ ohm-cm or greater at superconducting temperatures.

The matrix material should have the strength and ductility needed to satisfy the anticipated service requirements and to sustain forces and stresses encountered in the metal working operations employed to co-reduce the composite and its constituents. Service requirements include strength and ductility to satisfy magnetic, centrifugal and otherwise induced tensile loads and proper ductility, bendability and the like to permit winding and other procedures often desirably employed in utilizing superconductors. Obviously, materials should be capable of sustaining the service requirements anticipated at both superconducting and other temperatures. If drawing or other metal working operations are employed requiring tensile strength in the matrix, obviously the matrix needs to sustain such and tensile strength and ductility levels become important in this respect also. In general, the modest to relatively high tensile strength aluminum alloys typically exhibiting strength ranges varying from about 20,000 psi up to about 80,000 or even 90,000 psi can be employed, although tensile levels of around 40,000 to 60,000 psi are usually suitable and sometimes preferred as offering satisfactory tensile strength together with good ductility. It has to be remembered in speaking of strength that temper becomes a factor in that for a given alloy the strength level can range from, for instance, about 6,000 psi in the annealed condition to about 70,000 psi in a cold worked temper such as the H18 or H19 temper.

The matrix material should have the strength and ductility needed to satisfy the anticipated service requirements and to sustain the forces and stresses involved in the metal working operations employed to co-reduce the composite and its constituents. It is important in practicing the invention that the matrix material have metal working characteristics compatible with those of the superconducting tubing to enable working the composite as set forth herein to achieve the desired substantially uniform reductions to provide a reduced cross-section closely proportional to the starting condition. This enables working the improved composite to produce improved superconductor products of greatly reduced cross-section from the starting stock without non-uniformity introduced by irregular or non-uniform metal movement during the metal working operations. Basically in accordance with the invention the ratio of flow stress between the superconductor and matrix preferably should be 6 or less during the entire metal working process. By flow stress is meant the level of stress required to make the material undergo plastic flow under a given set of conditions such as the particular metal working operation (extrusion, drawing, rolling, or other), strain or deformation rate, temperature and other factors influencing flow stress. The flow stress, of course, for a particular material can vary according to the particular conditions involved, and it is possible that a matrix-superconductor combination suitable for one set of conditions might be less suited to a different set of conditions. A stress ratio of not over 6 should be maintained even though the individual strain hardening behavior and strain rate sensitivities differ for the superconductor and for the matrix during the metal working operations. This condition of flow stress ratio produces stable laminar metal flow patterns during working, thus assuring the desired uniform reduction rates between the matrix and superconductor. Higher ratios of up to 7 or 8 are less preferred and ratios of even up to 10 can be operative provided special care is exercised during metal working operations. Such special care would include lower reduction ratios and lower die angles for extrusion and drawing operations and lower reductions per pass for rolling.

Preferably the matrix material is an aluminum alloy so as to provide reduced weight and a good strength to weight ratio. One preferred alloy is alloy 5056 type containing 4.5 to 5.6% magnesium and 0.05 to 0.20% each of manganese and chromium, the balance essentially aluminum. This alloy has metal working characteristics quite compatible with the preferred titanium-niobium superconductor, the flow stress ratio typically ranging from around 3 or so to around 5 or so for extrusion and relatively cold drawing, and superconductor composites embodying such have been produced with substantial success. Hence, one preferred embodiment contemplates aluminum alloys containing about 3½ to 6 or 7% magnesium, preferably 4 to 6% Mg, along with additional strengthening elements such as about 0.05 to 0.25% of Mn or Cr, or both, or 0.25 to 0.8% Fe. Examples of other aluminum alloys believed suitable for use as matrix material include those shown in Table I which is intended to simply exemplify alloys suitable in practicing the invention. In general, suitable aluminum alloys include strain hardenable and heat treatable alloys containing from about 1 or 2 up to about 10 or 15% or more of one or more alloy additions from the group selected from up to about 3% silicon, up to about 6% copper, up to about 2% manganese, up to about 10% magnesium, up to about 10% zinc, up to about 0.5% chromium, up to about 2% iron, nickel or cobalt and the various other alloying additions associated with aluminum.

TABLE I

| Alloy | Si | Cu | Mn | Mg | Cr |
|-------|-----|--------|-------|---------|--------|
| 5083  | —   | —      | .4–1  | 4–4.9   | .05–.25|
| 3003  | —   | .05–.2 | 1–1.5 | —       | —      |
| 2024  | —   | 3.8–4.9| .3–.9 | 1.2–1.8 | —      |
| 6066  | .9–1.8 | .7–1.2 | .6–1.1 | .8–1.4 | —   |
| 7075  | —   | 1.2–2  | —     | 2.1–2.9 | .18–.35|

In addition to aluminum alloys as described above, other alloys which should be suited as the matrix material include copper, iron and nickel and their alloys. Among such are copper base alloys containing around ½ to 40%, or typically 10 to 30%, nickel and up to around 1% zinc, the balance essentially copper. Also included are copper alloys containing up to 10% Be, typically ½ to 3% Be. These are, respectively, the so-called copper-nickel alloys and copper-beryllium alloys known in the metal arts. Other metals and perhaps even nonmetals having the desired properties as set forth herein can serve as the matrix material although as described above aluminum alloys are presently preferred. The principal requisites for the matrix are that it have relatively high resistivity at superconducting temperatures of at least $10^{-7}$ ohm-cm and that it have the needed strength and ductility for service and fabrication purposes together with a proper flow stress ratio in comparison with the superconductor, all as explained above.

It is also possible to provide the matrix in powder alloys including aluminum powder alloys of the oxide strengthened or other types of aluminum powder alloys. For instance, a known aluminum powder alloy containing nominally about 6% aluminum oxide has flow stress and other properties suited for use as a matrix in the improved composite. The powder is suitably atomized powder which can be compacted and sintered to provide suitable matrix stock and typically is of the oxide strengthened type such as containing up to around 10% oxide. Broadly speaking, the term aluminum and its alloys as used herein contemplates such as derived from casting an ingot suitable for working (casting derived) or from powder techniques (powder derived).

The matrix material is fabricated into or provided as a body 16 of the form depicted in FIGS. 1 and 2 (which also show the superconducting tubes and stabilizing cores). The matrix material is provided with holes for the tubes by working, drilling, machining or casting in place. One technique contemplates casting in place about graphite or other inserts and the later removal of the same after solidification similar to procedures disclosed in U.S. Pat. No. 3,794,100, incorporated herein by reference, and which issued on Feb. 26, 1974, to Jan W. Raymond and Clay N. Whetstone. These procedures are convenient to provide holes in the billet suitable for superconducting tubes having hexagonal configurations, for example, as depicted in FIG 3. When tubes having circular cross-sections as shown in FIG. 1 are used, it is often convenient to drill holes in the billet to the desired size. The holes should be of controlled size, spacing and alignment and should have clean and smooth surfaces. Where the matrix is provided as a powder, typically the powder is compacted and sintered to provide a cylinder and holes are drilled to accommodate the tubes and the procedure otherwise is basically in accordance with the situation where the billet is derived from cast material.

In assembling the cores 14, tubes 12 and matrix material 16, it is important that each component fit within the other with some precision in order to further facilitate laminar and uniform metal flow conditions such that coreducing of the assembly may be achieved with a minimum of breakage and other problems. The effects of proper fit and other precautions are often manifested in the initial metal working operations but can extend through subsequent operations as well. For instance, where the initial operation is extrusion, a tight, or at least consistent fit of the various components favors an instantaneous, or at least uniform response to extrusion pressure which, in turn, favors uniform and laminar metal flow conditions to produce an extrusion of uniform characteristics which, in turn, favors uniformity in subsequent drawing operations. In placing the cores 14 in the superconducting tubes 12, preferably there is a friction bond or intimate contact between them. Such bonding or contacting can be achieved by placing the stabilizer rod 14 in tube 12 and drawing the tube 12 about the rod 14 to provide firm contact between. Before placing the rods 14 in tubes 12, the tube should preferably be treated to provide sound and clean surfaces. The niobium-titanium or other superconductor tube produced by normal fabrication techniques can have small particles or chips similar in composition to that of the tube located on the inside wall 20 of tube 12, and these particles or chips can interfere with the metal reduction operations in that they might not be reduced to the same extent as the tube material and this can lead to breakage in later metal working operations on the composite. Such chips can be removed from the inside of the niobium-titanium tube by pickling or chemical milling or drilling. One presently preferred practice contemplates subjecting the inside of the tube to a solution of hydrofluoric and nitric acids.

After the niobium-titanium tube 12 has been drawn or sunk over the rod of stabilizer 14 to provide a composite with substantially no voids between the inner face of the tube and outer surface of the stabilizer rod, the composite may be further reduced by drawing to achieve a cross-sectional dimension which is just slightly smaller than that of one of the holes in the matrix material 16 thereby providing an annular gap which may be in the range of about 0.001 inch to 0.010 inch with a preferred gap size being in the order of 0.002 to 0.003 inch. Before assembling with the matrix 16, the tubes should be cleaned to remove lubricant and other contaminants by any convenient method, i.e., sand blasting and subjecting to a light etch in a solution of hydrofluoric-nitric acid.

It should be understood that the composite of the tube 12 and stabilizer rod or core 14 may not have to be reduced as indicated above if the outside dimension of the tube is made to conform to within the dimensions required for the holes in the billet. Also, there are instances when tube 12 does not have to be drawn or sunk around the rod 14 and a radial gap of around 0.001 to 0.003 inch or less may be tolerated.

The tubes 12, preferably cleaned as just explained and containing the stabilizing material 14 are placed in the holes provided in the matrix material body 16. To assure uniform response to initial metal working forces, the fit between the matrix and the superconductor tube may feature a small gap referred to above or it can be fairly tight. A fairly tight fit can be accomplished by heating the matrix body to 200° or 300° F. to favor a shrink fit on appropriately sized tubes.

The composite 10 comprising the matrix material 16 and the tubes 12 and cores 14 as shown in FIG. 1 is encased in a capsule as shown in FIG. 2 in contemplation of the metal working operations to be performed thereon. Referring to the particular arrangement of FIG. 2, a capsule is shown suitable for extrusion. The composite assembly 10 is placed inside copper sheath 71 and then placed within a tight fitting aluminum can 72 comprising wall portion 76 and bottom portion 80, typically joined by welding. As explained above, a suitable aluminum material is 3003 alloy although other aluminum alloys such as 1100 also are believed suited. The principal requisite here is relatively low shear stress and ease of metal flow along with sufficient strength to sustain the metal working operation. This often eases the extrusion which, because of the strength and other properties of a suitable matrix having appropriate flow stress characteristics as herein explained, can otherwise present problems in extrusion. Referring to FIG. 2 the nose portion 82 is then welded to the can to facilitate a substantially hermetically sealed encapsulation of the composite assembly 10 and air is evacuated and the capsule then finally sealed. It should be noted that the nose cone features a tapered portion to facilitate initiating metal flow through the extrusion dies. The capsule assembly 70 is then extruded to provide an elongate rod which is then stripped to remove any surface copper or jacket metal and then further drawn to the final or desired gauge. If desired, the composite may be annealed or partially annealed between metal working steps, especially where the steps are cold working steps, since such can facilitate maintenance of the desired flow stress relationship described earlier. That is, if the aluminum matrix strain hardens at an excessive rate, such could interfere with metal working operations which can be alleviated by, for instance, a partial annealing treatment.

The capsule assembly prepared as above is then extruded by urging, nose cone first, through a die aperture to reduce its cross-section. It is desired that the reduction be uniform such that the reduced section represents a miniaturized copy of the stock before extrusion. This is accomplished by maintaining substantially directional, uniform and laminar flow conditions through the working operation which, in turn, is facilitated by properly balancing the working characteristics of the superconductor and matrix materials as explained hereinabove and by properly controlling metal working conditions to assure the desired laminar flow. In the case of extrusion, die configurations and extrusion procedures favoring laminar flow include dies with shallow draft angles and radii at intersections of surfaces. By a shallow draft angle is meant an angle of 5° to 45° with the axis, preferably about 10° to 30°. It is desired that when extrusion forces are applied to the extrusion stock or capsule assembly 70, a rather gentle and uniform rate of deformation or strain is initially encountered which then increases to a maximum point and then decreases as the extrusion exits the die. This is conveniently accomplished by providing radii at each end of a generally tapered die configuration. One such arrangement would include a concave portion at the large end of the die, the end which has a size or diameter approximately matching that of the extrusion capsule assembly 70 followed by a convex curve at or near the exit, the respective curved portions connecting together or being spaced by a tapered portion. If the respective radii are relatively large, the tapered portion can be relatively small, but where the radii themselves are small, the tapered portion takes on a more prominent aspect. In general, it is preferable to have a rather generous radius for the concave portion at the die entrance in order to provide the relatively gentle transition required for the relatively gentle working or strain rate desired at the initial stages of extrusion through the dies, whereas the radius toward the exit end, the convex portion, can be a little smaller without introducing serious problems. As indicated, a condition wherein the concave portion connects directly to the convex portion is suitable in practicing the invention and in some cases may be preferred, whereas the embodiment wherein the convex and concave portions are separated by a more or less straight conical section might be preferable in other situations, although here the length of the die can become substantial since shallow draft angles are preferred. One arrangement favored in practicing the invention is to have the convex radius at the die entrance several times, for instance 2 to 5 times, the length of the radius of the convex portion at the die exit, the respective radii connecting directly without a tapered or conical transition zone. This would place the inflection point between the respective concave and convex sections closer to the die exit than the die entrance, for instance from ½ to 9/10 of the distance from the die entrance to the die exit. However, it will be apparent to those practicing the art that many die configurations can be employed to achieve laminar flow conditions employing principles generally recognized in selecting laminar flow dies, although certain configurations as expressed herein are preferred in practicing the invention.

The reduction in area achieved by extrusion can vary substantially depending on the desired amount of work to be effected at this point and on the limitations of the apparatus and other conditions involved in the particular extrusion or metal working system involved. Typical reductions in practicing the invention can range from 4:1 up to 75:1 with a typical reduction being about 16:1 and with preferred reductions ranging from about 8:1 up to about 30:1. The extrusion technique can be the so-called direct or indirect extrusion techniques or even the hydrostatic technique. Also, the extruded rod itself can be re-extruded as by employing basically the same procedures used in the earlier extrusion.

When the initial working operation is extrusion, the initial working stock temperature may be about 70° to 500° F. with a temperature range of about 150° to about 400° being quite suitable for the specific composites disclosed herein. However, it has to be remembered that when altering the respective matrix and superconductor materials, it can be important to select a metal working temperature wherein the flow stress ratio between the superconductor and matrix material is properly balanced in accordance with the conditions explained hereinabove. Hence, it is difficult to set forth temperature, and for that matter other metal working conditions, in extremely detailed fashion since such can vary depending on choice of materials. Nonetheless temperature and strain rate, which can translate to extrusion rate in the case of extrusion, are significant variables in balancing the flow stress relationship as explained hereinabove. In the case of extrusion at temperatures of about 250° for the specific composites disclosed herein, a typical extrusion rate might be in the wide range of 5 to 100 inches per minute with a rate of about 15 to 30 inches per minute being quite suitable.

After the extrusion step, the extrusion is treated to remove the material forming the container 72 for the capsule 70. That is, the extrusion is stripped of the outer layers of aluminum alloy and copper. These will be present as superficial or skim type layers since the flow through the die is laminar and the basic configuration of the extruded section represents simply a miniaturized or reduced version of the original extrusion stock. Hence, any convenient procedure to remove the surface layers can be employed. For instance, in the specific system herein described above, the outer layer of the extrusion would be aluminum alloy 3003 which is readily removed by hot caustic. Next the layer of copper can be removed by treatment with nitric acid. The copper layer permits selective removal of the skim layers in this fashion without removing substantial amounts of matrix material. This then readies the extruded composite stock for further reduction as by drawing. It is sometimes desirable to remove the copper and 3003 aluminum layers since they can be too thin to reliably sustain subsequent drawing operations. Where, however, the subsequent drawing or other operations are not severe, the layers can sometimes be retained.

Of course, metal working procedures often require effective lubricants to perform properly and the invention contemplates the use of such. Generally the matrix material can serve as the starting point in selecting a lubricant in that a lubricant which is effective for the matrix material itself in a given metal working procedure would, in many instances, serve well where the matrix is employed in the improved composite. Where extrusion is employed and an aluminum alloy is the matrix, suitable lubricants can include oil base lubricants or dry lubricants like waxes, films of varnish, paint, soaps, or the like along with teflon, nylon, polypropylene or polyethylene.

Extrusion lubricants can be applied along the cylindrical surface of extrusion capsule 70 and along the tapered nose cone portion as it is positioned in registry with the die or to the inside of the extrusion container or the die.

In accordance with generally recognized procedures the stock, in this case the extrusion produced as described above, can be drawn through a succession of progressively smaller dies to produce a relatively fine wire of any desired gauge. The drawing is normally at room temperature although, obviously, some amount of heating of the material is typically associated with the reductions encountered in drawing. To facilitate drawing particularly when the matrix material is an alloy known to present difficulties in drawing, the extruded composite can be provided with a coating of material having a low shear stress. Such coatings may be metallic such as copper, lead, a soft clad of aluminum, or other metals known to be useful for this purpose or they may include nonmetallic materials such as films of varnishes, paints, waxes, soaps or plastics. In addition, suitable lubricants should be employed as is widely recognized in the art, and these can include mineral or vegetable oils, together with conventional additives such as emulsification agents, stabilizers, wetting agents and the like. The extruded composite, as explained above, can be drawn to any desired gauge size by employing cold reductions of up to 50% or more, reductions of up to 75% and even up to 90% or in excess of 98% or more being feasible. It is preferable where the matrix is of the above-described aluminum alloys or copper nickel alloys to employ intermediate anneals at about 50 to 75% or so reduction in cross-sectional area. Typical annealing times and temperatures are in the range of about 300° to 800° F. for about ½ to 2 hours. The anneal may be complete or partial as desired in accordance with known principles to facilitate further working reductions and to achieve desired strength levels or other conditions in the final wire composite product.

In addition to reducing the size of the superconducting composite to a desired gauge size, the metal working operations serve another important function in that they assure an intimate bond between the superconducting tubular member and the core therewithin and the matrix therewithout. This intimate bond facilitates electrical and heat transfer between the different constituents of the superconducting composite and its surroundings. That is, between the stabilizing core 14 and the tubular superconducting member 12 an intimate bond assures ready transfer of electrical and thermal energy. Between the superconducting tubular member 12 and the matrix 16 an intimate bond facilitates heat transfer. The transfer of energy transients is of importance as explained much earlier in this description and the intimate bond assures this transfer. Hence, working the composite to reductions of at least 50% or preferably 80% is often important to favor the assurance of the intimate bond.

At some point in the production of the improved superconductor composite wire, the composite can be heat treated if needed to bring the superconducting characteristics of the superconducting members to a proper level, typically by inducing precipitation of constituent phases from solution in the superconductor material. Such treatments are known in the art as exemplified by A. D. McInturff and G. G. Chase in "Effect of Metallurgical History on Critical Current Density in Nb-Ti Alloys" appearing in the Journal of Applied Physics, Vol. 44 - No. 5; May 1973, pp. 2378-2384. A typical precipitation heat treatment in the case of an Nb-Ti superconductor would involve bringing the composite to a temperature of about 500° to 1000° F. for about 3 to 175 hours. In some instances it is desired that the precipitation heat treatment be performed prior to the final drawing passes so as to allow for about 30 to 75% cold work after the precipitation treatment to more uniformly distribute the precipitate in the superconductor.

In addition to the other treatments disclosed herein, it is desired that the stabilizing core in the composite be in its condition of high conductivity which can be diminished by severe cold working encountered in drawing operations. It is generally recognized that metals in the annealed condition have higher conductivity levels than those in work hardened conditions and such applies to most stabilizer core materials, for instance such applies to high purity aluminum stabilizer cores. In accordance with the invention the stabilizing or current carrying characteristics of the core can be enhanced by as much as 35% by assuring that the stabilizing core, where the core is aluminum, is annealed after cold working. In the case of high purity aluminum stabilizers, such can be annealed at about 200° to 300° F. for a period of about ¼ to 2 hours. This amount of annealing will sufficiently relax the strains in the core, which occurs rather readily for high purity aluminum, without excessively detracting from the strengthening effects of prior strain hardening in the matrix material where the matrix is an aluminum alloy of the general types herein mentioned nor does it detract from the current carrying capacities of a niobium-titanium superconductor.

As explained in the initial portions of the description, the stabilizer core functions as something of an emergency current carrying media at superconducting temperatures, whereas the matrix material functions as a relatively highly resistive material at superconducting temperatures. In this connection there is a definite advantage achieved with the present invention in that the stabilizer does not have its stabilizing capacity permanently impeded during fabrication and heat treatment. In many previous composites employing high purity aluminum as a stabilizer, the stabilizer was positioned in such a way that impurities could migrate into the stabilizer during the elevated temperature heat treatments typically employed in heat treating the superconductor to improve its conductivity. Thus, the situation often involved a conflict in that the very treatment that tends to enhance superconductivity degrades the stabilizing capacity of the stabilizer. This would occur because of the impurity migration as mentioned earlier which was facilitated by the typical previous arrangements having superconductor cores, aluminum stabilizers surrounding the cores and an aluminous or copper type matrix. The alloying ingredients from the aluminum matrix or the copper from a copper matrix readily migrate or diffuse into the stabilizer layer seriously curtailing its stabilizing character. For instance, analysis has shown that in the conventional superconductor composites where the core is niobium-titanium, the stabilizer is high purity aluminum in the form of a tube-like member about the core and the matrix is an aluminum alloy containing about 5% magnesium, and where a temperature of 750° F. is employed in precipitation heat treating the superconductor, there was up to 1% of magnesium diffused into the high purity aluminum which drastically reduces the current carrying capabilities at superconducting temperatures. This problem area is completely alleviated in practicing the present invention since the high purity aluminum stabilizer is separated from the matrix material by the superconductor.

In addition to this advantage, placing the respective positioning of the elements in the improved composite tends to alleviate the so-called flowing phenomena problem mentioned at the outset of this description wherein the relatively soft stabilizing material flows unevenly during fabrication to produce necking and the attendant breaking problems. The improved superconductor and method of forming such readily facilitates reductions from about 6 inches in diameter for the initial extruding stock to relatively small diameters of about 0.027 inch or smaller without breakage problems previously associated with the flowing phenomena thus providing a ready method of obtaining such fine multifilament superconductor wires which are often desired for specialized applications.

Figure 4:
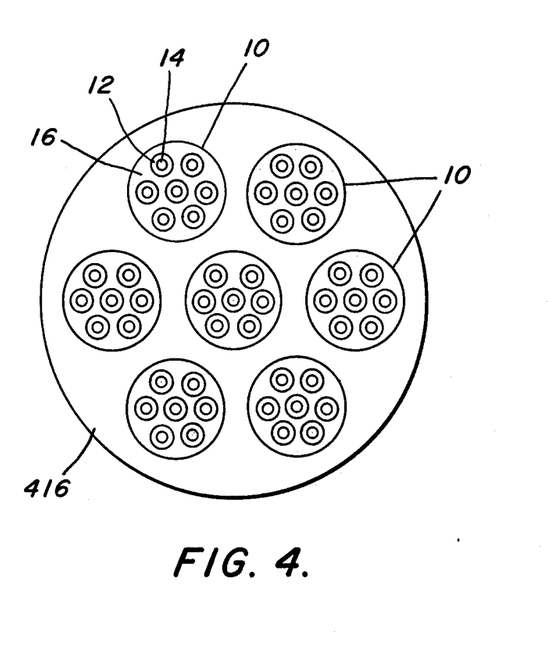
FIG. 4 is an elevation view in cross-section illustrating an alternate embodiment of the superconductor composite of the present invention.

Composites containing multiplicities of superconducting elements are readily produced in practicing the invention as illustrated in FIG. 4. This involves taking extruded or even drawn superconducting composites produced such as described above and placing them in holes in a matrix of the type described hereinabove. Thus, each hole in the matrix 416 would contain a composite 10 comprising a plurality of superconducting tubes 12 and stabilizing cores 14 situated in a matrix 416. The resulting composite is then extruded and drawn as described hereinabove or otherwise reduced by working to provide a composite containing multiplicities of superconducting elements; that is, the number of superconducting elements can be increased by the square of the number of superconducting members or elements in the original composite. In some cases extruded and drawn composites can be close packed in a can or working capsule for reworking without a separately provided matrix 416. For instance, composite stock in accordance herewith is extruded and drawn to round rod shapes of around ½ or ¾ inch diameter which are reshaped by rollers or dies to similar sized hexagonal rod. The hexagonal rod is arranged in a close packed array within a cylindrical can with peripheral gaps filled with wire or other suitable material and the can is closed to provide a capsule for reworking as by extrusion and drawing. A preferred practice contemplates providing the rod, before packing, with a coating to favor bonding among the rods during working operations. Such coatings can be provided as metallic cladding or plating in copper, pure aluminum, silver, gold, cadmium or any metal which favors bonding. This can be significant where the matrix for the hexagonal rods is not itself especially suited to bonding such as where the matrix is an aluminum alloy containing substantial amounts, for instance 1% or more, of magnesium. As is generally recognized, aluminum alloys containing magnesium tend to exhibit an oxide film which interferes with bonding. While careful cleaning can be helpful in dealing with the oxide film, the clad or plated metallic coating, properly selected to favor bonding, can be more advantageous. Such a coating can be applied after extrusion of the original stock and be retained as such is drawn down and worked to the ½ or ¾ inch hexagonal shape. While a hexagonal rod may be preferred, other shapes such as square, rectangular or triangular might be useful although the hexagonal shape offers advantages as to ease of formation and packing.

If high tensile strength is important, it is feasible to position a member providing very high tensile strength in one of the holes in the billet. The flow stress of such material should be compatible with the matrix along general lines outlined above as the matrix-superconductor flow stress compatibility.

Typical gauge sizes for the improved superconducting composite can range from around ⅜ inch down to around 0.010 inch with sizes of around 0.040 inch to around 3/16 inch being typical. As explained earlier round, rectangular, square or other shapes are contemplated. Typical superconductor filament sizes in the composites can be as low as 0.003 inch or even lower with 0.002 inch and still smaller being possible.

The invention and its advantages are illustrated in the following examples.

EXAMPLE 1

A right cylindrically shaped body of aluminum alloy 5056 about 6⅜ inches in diameter and 12 inches long was drilled to provide 54 holes around 0.61 inch in diameter for the insertion of superconductor elements. Tubes fashioned from 45% niobium-55% titanium alloy and having an outside diameter of about 0.85 inch and a wall thickness of about 0.18 inch were first cleaned on the inside to remove particles, chips, etc., by treatment with a hydrofluoric-nitric acid solution containing equal parts of the acids and 50% water at about 130° F. The outside of the tubes were grit blasted and a lubricant applied thereto. Rods of 99.999% pure aluminum about 0.425 inch in diameter were cleaned in a hot caustic soda solution, and after rinsing, inserted into the Nb-Ti tubes and the tubes were then drawn down to a diameter of about 0.606 inch to effect a friction fit with the pure aluminum rods and fit properly in the holes in the matrix. After cleaning, the tubes containing the rods were inserted into the 54 holes in the matrix body.

The billet was inserted into a can made up of a copper inside layer about 0.032 inch thick and an outer layer of 3003 aluminum alloy about 0.125 inch thick, and a circular plate of aluminum alloy 3003 was welded to one end of the cylinder and a conical portion of aluminum alloy 3003 was welded to the opposite end to provide an assembly of the type depicted in FIG. 2. Polypropylene lubricant was placed around the billet and the assembly was extruded at an initial stock temperature of about 250° F. and a ram speed of around 20 inches per minute, employing a laminar flow die in the concave-convex configuration described earlier. The diameter of the total assembly before extrusion was about 6.3 inches and the extruded rod had a diameter of about 1.6 inches. The extruded rod was stripped of its outer 3003 aluminum alloy and copper layers and then drawn through low angle dies employing standard reductions substantially at room temperature to a diameter of about 0.0275 inch. Intermediate anneals at 550° F. for about 1 hour were employed after each reduction of about 75% or so. Examination of the drawn composite indicated that it contained the 54 superconductor tubes which now had an outside diameter of only 0.0028 inch and a wall thickness of only 0.0006 inch. The spacing and configuration was very accurately proportional to the arrangement in the initial starting stock except for the greatly reduced scale thus indicating that the integrity of the superconductor composite system was maintained throughout the metal working operations and preserved in the final fine wire size. Examination of the composite revels a highly uniform coreduction of the composite and its constituents as manifested in size and proportion and in internal structural aspects.

At a wire gauge of about 0.101 inch some samples received a precipitation heat treatment of around 670° F. for about 168 hours (1 week) and the wire was subsequently drawn to 0.072 inch followed by simultaneous twisting to a twist pitch of about ⅝ inch and drawing to about 0.064 inch. This amounted to a cold reduction in area of about 60% following the precipitation treatment. The wire next received a thin insulating chromium phosphate conversion coating to provide electrical insulation while allowing for heat transfer levels generally superior to converted wire insulating compounds.

It can be seen from this example that relatively fine superconductor composite wire can be produced by the practice of the invention which features properly spaced and related superconducting elements and that the wire can be twisted during drawing if desired.

EXAMPLE 2

Using the same metal composition for matrix, superconductor and stabilizer as indicated in Example 1, a superconductor composite of slightly different configuration was fashioned. A right cylindrical billet containing 19 hexagonally shaped holes was fabricated by casting in a cylindrical mold. After the 5056 molten metal had been poured into the mold, preheated graphite cores of hexagonal section were lowered into the melt which was then progressively solidified from the bottom, after which the graphite cores were removed to provide 19 hexagonally shaped holes about 0.627 inch across opposite sides. The billet diameter, after turning on a lathe, was about 4½ inches. The Nb-Ti tubes had a hexagonal outside shape featuring about 0.625 inch across opposite sides and an inside diameter of about 0.39 inch into which pure aluminum rods were inserted and the tubes containing the rods then placed into the hexagonal holes in the billet. The billet was prepared for extrusion as outlined in Example 1 and then extruded at room temperature into a rod which was stripped and then drawn down to about 0.057 inch in diameter. The thus produced composite wire featured hexagonally shaped superconductors with about 0.008 inch across opposite sides with the tube inside diameter containing the pure aluminum stabilizer being about 0.005 inch. Examination of the wire indicated that it represented an almost exact duplication of the original starting stock in configuration, spacing, size, etc., except on a miniaturized scale.

While the invention has been described in terms of certain preferred embodiments, such is intended to be illustrative of, and not necessarily a limitation of, the invention. For instance, a substantial amount of emphasis is placed on the extrusion process as the initial metal working process since laminar flow conditions are more readily achieved with extrusion than with certain other metal working processes. However, it is believed other metal working procedures can be employed on the initial working stock and intermediate products produced thereby provided they are arranged to facilitate the important laminar flow conditions. Such include rolling, drawing, swaging, and possibly others. It has to be emphasized that laminar flow is facilitated in accordance with the invention by the selection of metal working procedures favoring such but, equally or more importantly, by the proper selection of matrix-superconductor combinations in accordance with the guidelines set forth herein and it is in this sense that the invention should be viewed as a whole. That is, various combinations can be employed provided the flow stress conditions are balanced for the particular working procedures employed, all as explained hereinabove.

While drawing need not be employed, such offers economies in achieving fine sizes. In fact, one of the very advantages in practicing the invention is that stock suitable for use in existing wire drawing systems is produced and can be drawn through these existing systems to produce relatively fine composite wire sizes of configuration and distribution substantially identical with the initial starting stock except for the miniaturization produced by the working reductions. This is an important aspect of the invention since the production of such on an economical and commercial scale is not believed to have been heretofore practical and the invention obviously offers a very substantial advance in the art of producing multifilament superconductor composites in a commercially feasible manner.

While this invention has been described in terms of preferred embodiments, the claims appended hereto are intended to encompass all embodiments which fall within the spirit and scope of this invention.

We claim:

1. A method of producing a worked superconductor composite comprising a plurality of individually stabilized superconductor elements in a normally resistive matrix, said method comprising the steps of
    (1) providing a composite working stock comprising an aluminum alloy matrix metal said alloy consisting essentially of at least 1% of alloying additions selected from the group consisting of up to 3% Si, up to 6% Cu, up to 2% Mn, up to 10% Mg, up to 10% Zn, up to 0.5% Cr, up to 2% Fe, Ni or Co, balance substantially aluminum and incidental elements and impurities, said aluminum alloy matrix having a substantially high electrical resistivity of $10^{-7}$ ohm-cm or more at superconducting temperatures said aluminum alloy matrix metal being in the form of workable stock, said aluminum alloy matrix metal having situated therewithin a plurality of spaced substantially parallel elongate tubes of a workable metal superconducting at superconducting temperatures and, situated within said elongate tubular superconductor tubes, stabilizing cores of substantially pure aluminum having an electrical resistivity of $10^{-8}$ ohm-cm or less and substantially greater than the superconductor tubes but substantially less than the matrix metal at superconducting temperatures, the respective metals for said matrix and superconductor tubular members being selected such that the initial ratio of the flow stress between superconductor and matrix is 8 or less which said flow stress ratio is maintainable at said level of 8 or less substantially throughout metal working operations whereby the superconductor tubes and matrix are laminarly co-reducible by metal working operations:
    (2) subjecting said composite working stock to at least one metal working procedure to reduce its cross-sectional area and elongate its length to a substantial extent, said working procedure being conducted so as to favor laminar flow conditions and maintain said flow stress ratio at said level of 8 to 1 or less to uniformly co-reduce said composite stock and each member within said composite stock to provide a superconducting composite body having said stabilizing core members, said superconductor tubular members and said resistive matrix all substantially proportionally reduced in cross sectional size and intimately bonded together.

2. The method according to claim 1 wherein said metal working procedures include extrusion through a substantially laminar flow die.

3. The method according to claim 1 wherein said metal working procedures include extruding through a substantially laminar flow die to provide an extruded elongate composite followed by drawing the extruded composite to form a substantially elongated cold worked composite wire product of substantially reduced cross section in comparison to the said composite working stock.

4. The method according to claim 2 wherein said extrusion is performed at an initial metal stock temperature of about 150° F. to 400° F.

5. The method according to claim 2 wherein said laminar flow dies include a shallow draft angle and radii at each end of said draft.

6. The method according to claim 1 wherein the extrusion is effected through a laminar flow die of shallow draft angle having a radius at each end, the radius at its entrance end being larger than the radius at its exit end by a factor of at least 2 to 1.

7. The method according to claim 1 wherein the superconductor is a metal selected from the group consisting of niobium, titanium and alloys thereof.

8. The method according to claim 1 wherein the superconductor metal comprises an alloy consisting essentially to from about 40 to about 60% niobium, balance essentially titanium and incidental elements and impurities.

9. The method according to claim 8 wherein said alloy additionally contains one or more elements from the group consisting of zirconium, hafnium, vanadium, molybdenum, rhenium, tungsten and tantalum.

10. The method according to claim 1 wherein said aluminum alloy consists essentially of 4 to 6% magnesium and 0.05 to 0.25% each of manganese and chromium, balance essentially aluminum and incidental elements and impurities.

11. The method according to claim 1 wherein said matrix material is powder derived.

12. The method according to claim 11 wherein said powder contains up to b 10% oxide.

13. The method according to claim 1 wherein said composite is worked to provide a cold worked wire composite imparted with strain hardening effects which is annealed at 200° to 300° F. to place said core in an annealed condition thereby to favor its stabilizing characteristics while retaining substantial strain hardening effects in said aluminum alloy matrix to enhance its strength.

14. The method according to claim 1 wherein said superconductor comprises an alloy consisting essentially of from about 40 to about 60% niobium, balance essentially titanium and incidental elements and impurities, and wherein said metal working procedures include extruding through a substantially laminar flow die to provide an extruded elongate composite followed by drawing the extruded composite to form a substantially elongated cold worked composite wire of substantially reduced cross section in comparison to the said composite working stock and said wire is thermally treated at about 500° to 1000° F. to effect precipitation of some constituent phases in said superconductor elements and is further cold reduced by at least 30% in area to uniformly distribute said precipitate in said superconductors in the cold worked composite wire so produced.

15. The method according to claim 14 wherein said so-produced cold worked composite wire imparted with strain hardening effects is annealed at 200° to 300° F. to place said core in an annealed condition thereby to favor its stabilizing characteristics while retaining substantial strain hardening effects in said aluminum alloy matrix material to enhance its strength and in said superconductor tubes to enhance superconductivity.

16. The method according to claim 1 wherein said metal working procedures include extruding through a substantially laminar flow die to provide an extruded elongate composite followed by drawing the extruded composite to form a substantially elongated cold worked composite wire of substantially reduced cross section in comparison to the said composite working stock and said wire is thermally treated at about 500° to 1000° F. to effect precipitation of some constituent phases in said superconductor element and is further cold reduced by at least 30% in area to uniformly distribute the precipitate in said superconductor in the strain hardened wire so produced and said wire is annealed at 200° to 300° F. to anneal said core to favor its stabilizing characteristics while retaining substantial strain hardening effects in said matrix to enhance its strength.

17. A method according to claim 1 wherein said metal working procedures include extruding to provide an elongated extruded composite followed by drawing the extruded composite to form a substantially elongated composite wire product of substantially reduced cross section, said drawing including reductions totaling in excess of 90%, intermediate anneals being effected periodically to facilitate reductions.

18. The method according to claim 1 wherein the said superconductor comprises an alloy containing 40 to 60% niobium, balance essentially titanium and wherein the composite work stock is encapsulated in a can comprising a readily worked aluminum base alloy, the can having at one end a tapered conical substantially solid metal portion, the can being evacuated and hermetically sealed, the encapsulated working stock being extruded by urging it, conical portion first, through a laminar flow die having a shallow draft angle and a radius at each end, the radius at the entrance being at least twice as large as the radius at the exit.

19. The method according to claim 18 wherein said extrusion is at an initial metal temperature of about 150° to 350° F.

20. The method according to claim 1 wherein said stabilizer core is annealed after a cold working operation to enhance its stabilizing characteristics in the worked condition.

21. The method according to claim 1 wherein a plurality of elongate worked composite superconductor bodies produced in said step (2) are situated in a separately provided matrix in spaced substantially parallel relationship to provide further working stock for further working operations.

22. The method according to claim 1 wherein a plurality of elongate worked composite superconductor bodies produced in said step (2) are situated in close packed array to provide further working stock for further working operations.

23. The method according to claim 1 wherein said flow stress ratio is maintained at 6 or less substantially throughout the metal working operations.

24. The method according to claim 1 wherein said aluminum alloy matrix contains about $3\frac{1}{2}$ to 7% Mg.

25. A method of forming a worked superconductor composite comprising the steps of
 (1) providing composite working stock comprising:
  (a) a matrix composed of an aluminum base alloy consisting essentially of 4 to 6% magnesium and 0.05 to 0.25% each of manganese and chromium, balance essentially aluminum, said matrix alloy having an electrical resistivity of at least $10^{-7}$ ohm-cm at superconducting temperatures,
- (b) a plurality of elongate superconductor tubular members situated in spaced substantially parallel relationship within said matrix, said superconductor members being in an alloy consisting essentially of 40 to 60% niobium, balance essentially titanium, said alloy being workable to decrease its cross section and elongate its length,
- (c) stabilizing cores situated within said elongate tubular superconductor members and consisting essentially of high purity aluminum having an electrical resistivity of not greater than $10^{-8}$ ohm-cm and substantially less than said matrix at superconducting temperatures,
- (d) said matrix having a flow stress such that the flow stress ratio of superconductor to matrix is 8 or less and is maintainable substantially throughout metal working operations;

(2) encapsulating said composite working stock within a readily workable aluminum alloy can having at one end a substantially tapered conical substantially solid metal portion, said can being substantially evacuated and hermetically sealed;

(3) extruding said encapsulated composite working stock by urging it, conical portion first, through a laminar flow die having a relatively shallow draft angle and radii at each end thereof, the entrance radius being at least twice the exit radius to provide extruded composite stock;

(4) further working said extruded working stock by drawing such through a plurality of progressively decreasing dies to a reduction of at least 50%;

(5) annealing said stock;

(6) further drawing said stock to an additional reduction of at least 50%;

(7) precipitation heat treating said stock so as to effect in said superconductor portions thereof precipitation of constituent phases from solution thereby to enhance its superconductive properties by heating the composite to a temperature of about 500° to 1000° F.;

(8) thereafter further drawing said stock to a reduction of at least 30% in cross-sectional area to produce a superconductor composite wire in a strain hardened condition;

(9) subjecting said wire to a thermal treatment at a temperature of about 200° to 300° F. substantially anneal and relieve work hardening effects in said core member and enhance its stabilizing characteristics while retaining substantial amounts of strain hardening effects in said matrix and said superconductor tubes.

* * * * *